United States Patent
Kim et al.

(10) Patent No.: US 9,508,778 B2
(45) Date of Patent: Nov. 29, 2016

(54) ORGANIC LIGHT EMITTING DIODE DISPLAY

(71) Applicant: SAMSUNG DISPLAY CO., LTD., Yongin, Gyeonggi-Do (KR)

(72) Inventors: Nam-Hee Kim, Seoul (KR); Keun Soo Lee, Cheonan-si (KR); Sun Youl Lee, Hwaseong-si (KR); Kwang-Min Kim, Seoul (KR); Mi Kyung Kim, Asan-si (KR); Yang Wan Kim, Hwaseong-si (KR); Jong-Ryuk Park, Cheonan-si (KR); Kyung Jin Lee, Seoul (KR); Sang Min Yi, Suwon-si (KR); Sang Shin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/599,189

(22) Filed: Jan. 16, 2015

(65) Prior Publication Data

US 2015/0311473 A1    Oct. 29, 2015

(30) Foreign Application Priority Data

Apr. 25, 2014  (KR) .................. 10-2014-0050328
Oct. 6, 2014   (KR) .................. 10-2014-0134345

(51) Int. Cl.
*H01L 27/32*    (2006.01)
*H01L 51/00*    (2006.01)

(52) U.S. Cl.
CPC ....... *H01L 27/3246* (2013.01); *H01L 51/0011* (2013.01); *H01L 27/3216* (2013.01); *H01L 27/3218* (2013.01)

(58) Field of Classification Search
CPC .......... H01L 27/3206; H01L 27/3216; H01L 27/3218; H01L 27/3246; H01L 51/0002; H01L 51/0011; H01L 51/5253; H01L 51/56
USPC ................................ 313/498–512, 292, 609
See application file for complete search history.

(56) References Cited

U.S. PATENT DOCUMENTS 8,098,008 B2 *  1/2012  Kim .................... H01L 51/5228
                                                  313/504
8,242,692 B2 *  8/2012  Kim .................... H01L 51/5281
                                                   257/40

(Continued)

FOREIGN PATENT DOCUMENTS

JP      2005-322564    11/2005
KR  10-2007-0080131     8/2007

(Continued)

OTHER PUBLICATIONS

EPO Search Report dated Oct. 1, 2015, for corresponding European Patent application 15153104.3, (8 pages).

(Continued)

*Primary Examiner* — Donald Raleigh
*Assistant Examiner* — Kevin Quarterman
(74) *Attorney, Agent, or Firm* — Lewis Roca Rothgerber Christie LLP

(57) ABSTRACT

An organic light emitting device includes: a first substrate; a plurality of electrodes on the first substrate; a pixel definition layer on the plurality of electrodes and including a plurality of openings and respectively exposing the plurality of electrodes; and a spacer on the pixel definition layer, wherein the pixel definition layer includes a first opening and a second opening adjacent to each other along a first direction by an interval for each pixel, and a third opening adjacent to the first opening and the second opening by an interval along a second direction crossing the first direction, and wherein the spacer is at a crossing point of a first imaginary line extending in the first direction and passing between the first opening and the third opening and a second imaginary line extending in the second direction and passing between the first opening and the second opening.

20 Claims, 9 Drawing Sheets

(56) References Cited

U.S. PATENT DOCUMENTS

| | | | |
|---|---|---|---|
| 2005/0263757 A1* | 12/2005 | Lee | H01L 27/3211 257/40 |
| 2008/0180024 A1* | 7/2008 | Kwon | H01L 27/3244 313/504 |
| 2009/0322215 A1 | 12/2009 | Sung et al. | |
| 2010/0033084 A1* | 2/2010 | Ko | H01L 51/5012 313/504 |
| 2010/0097295 A1* | 4/2010 | Kwak | H01L 27/322 345/32 |
| 2010/0171416 A1* | 7/2010 | Lee | H01L 51/525 313/504 |
| 2010/0309172 A1 | 12/2010 | Oh et al. | |
| 2012/0086330 A1 | 4/2012 | Umeda et al. | |
| 2012/0098420 A1 | 4/2012 | Uchida et al. | |
| 2015/0008820 A1* | 1/2015 | Lee | H01L 27/3218 313/504 |

FOREIGN PATENT DOCUMENTS

| | | |
|---|---|---|
| KR | 10-0833773 | 5/2008 |
| KR | 10-2010-0003243 | 1/2010 |
| KR | 10-2013-0045299 | 5/2013 |
| KR | 10-2014-0015037 | 2/2014 |

OTHER PUBLICATIONS

KIPO Office action dated Apr. 21, 2016, for Korean priority Patent application 10-2014-0134345, (9 pages).

KIPO Notice of Allowance dated Sep. 1, 2016, with English Translation, for Korean Patent Application No. 10-2014-0134345 (5 pages).

* cited by examiner

ORGANIC LIGHT EMITTING DIODE DISPLAY

CROSS-REFERENCE TO RELATED APPLICATION

This application claims priority to and the benefit of Korean Patent Application No. 10-2014-0050328 and Korean Patent Application No. 10-2014-0134345 filed in the Korean Intellectual Property Office on Apr. 25, 2014 and Oct. 6, 2014, respectively, the entire contents of which are incorporated herein by reference.

BACKGROUND

1. Field

Aspects of embodiments of the present invention relate generally to an organic light emitting device.

2. Description of the Related Art

An organic light emitting diode display includes two electrodes and an organic emission layer positioned therebetween. An electron injected from one electrode that is a cathode and a hole injected from another electrode that is an anode are coupled with each other in the organic emission layer to generate an exciton, and the exciton emits energy to emit light.

The organic light emitting diode display has a self-luminous characteristic, and because it does not need a separate light source, unlike a liquid crystal display, it can have a relatively small thickness and weight. In addition, because the organic light emitting diode display exhibits high-quality characteristics such as low power consumption, high luminance, high response speed, etc., it is receiving much attention as a display device.

An organic light emitting device may include a first substrate, a pixel circuit having a thin film transistor, a first electrode coupled to the pixel circuit, a pixel definition layer having a plurality of openings exposing the first electrode, and a spacer positioned on the pixel definition layer. Also, an organic emission layer may be positioned corresponding to the opening on the first electrode, a second electrode is positioned on the organic emission layer, and a second substrate is positioned on the second electrode.

The spacer may be positioned at a space between a plurality of openings determining by the pixel definition layer, and may execute a function of supporting a deposition mask in an organic material deposition process using a deposition mask. In this case, foreign substances may be accumulated while an opening edge of the deposition mask is contacted with a top center of the spacer. During the deposition process, the foreign substances may accumulate such that a size thereof is increased, and the increased foreign substances may cause imprints in the pixel, thereby generating faulty pixels.

The above information disclosed in this Background section is only for enhancement of understanding of the background of the described technology and therefore it may contain information that does not form the prior art that is already known in this country to a person of ordinary skill in the art.

SUMMARY

Aspects of embodiments of the present invention relates generally to an organic light emitting device. Further, embodiments of the present invention relate generally to an organic light emitting device that is defined by pixels in a pixel definition layer.

Aspects of embodiments of the present invention include an organic light emitting device having a spacer structure minimizing or preventing foreign substance accumulation that may be generated by the opening edge of the deposition mask although the deposition process is executed while supporting the deposition mask by the spacer during deposition of the organic material.

Further, embodiments of the present invention include an organic light emitting device that may prevent or reduce imprints due to the foreign substance accumulation by preventing or reducing the foreign substance accumulation that may be generated by the opening edge of the deposition mask in the organic material deposition.

According to some embodiments of the present invention, an organic light emitting device includes: a first substrate; a plurality of electrodes on the first substrate; a pixel definition layer on the plurality of electrodes and including a plurality of openings and respectively exposing the plurality of electrodes; and a spacer on the pixel definition layer, wherein the pixel definition layer includes a first opening and a second opening adjacent to each other along a first direction by an interval for each pixel; and a third opening adjacent to the first opening and the second opening by an interval along a second direction crossing the first direction, and wherein the spacer is at a crossing point of a first imaginary line extending in the first direction and passing between the first opening and the third opening and a second imaginary line extending in the second direction and passing between the first opening and the second opening.

A first organic emission layer may be at the first opening of the pixel definition layer where a first organic emission material is located, a second organic emission layer may be at the second opening of the pixel definition layer where a second organic emission material is located, and a third organic emission layer may be at the third opening of the pixel definition layer where a third organic emission material is located.

At least one of the first organic emission material, the second organic emission material, or the third organic emission material may be on the pixel definition layer or the spacer.

The first imaginary line may pass between the first opening and the third opening in one pixel, the second imaginary line may pass between the first opening and the second opening respectively in pixels adjacent to each other in the first direction and adjacent to each other, and the spacer may include a first spacer at a crossing point of the first imaginary line and the second imaginary line.

A third imaginary line may extend in the first direction and pass between the first opening and the third opening in the pixels adjacent to each other in the second direction and adjacent to each other, and the spacer may include a second spacer at the crossing point of the second imaginary line and the third imaginary line.

The first spacer and the second spacer may be alternately arranged for each pixel along the first direction.

The first spacer and the second spacer may be alternately arranged for each pixel along the second direction.

The first spacer and the second spacer may face away from each other with the third opening interposed therebetween and protrude in opposite directions to each other.

The spacer may have a plane shape of a triangle.

The spacer may have a first side extending in the first direction, and a first apex facing the first side protrudes toward a region between the first opening and the second opening.

The spacer may have a first side extending in the first direction, and may have a plane shape of a polygon having a protrusion facing the first side and protruding toward a region between the first opening and the second opening.

The spacer may have a protrusion respectively protruding toward a region between the first opening and the second opening, and a region between the first opening or the second opening and the third opening.

The first imaginary line may pass between the first opening and the third opening in one pixel, a fourth imaginary line may extend in the second direction and passing between the first opening and the second opening in one pixel, and the spacer may be at the crossing point of the first imaginary line and the fourth imaginary line.

The spacer may be alternately arranged for one pixel along the first direction.

The spacer may be alternately arranged for one pixel along the second direction.

The spacer may have a plane shape of a triangle.

The spacer may have a first side extending in the first direction, and a first apex facing the first side protrudes toward a region between the first opening and the second opening.

The spacer may have a first side extending in the first direction and may have a plane shape of a polygon having a protrusion facing the first side and protruding toward a region between the first opening and the second opening.

The spacer may have a protrusion respectively protruding toward a region between the first opening and the second opening and a region between the first opening or the second opening and the third opening.

In the spacer, a cross-sectional thickness of a center on the plane may be greater than a cross-sectional thickness of an edge on the plane.

According to some embodiments of the present invention, in a method for manufacturing an organic light emitting device, the method includes: forming a plurality of electrodes on a first substrate; forming a pixel definition layer to cover the plurality of electrodes on the first substrate; forming a plurality of openings in the pixel definition layer to correspond to a plurality of electrodes to expose the plurality of electrodes; forming a spacer on the pixel definition layer; mounting a deposition mask having a mask opening corresponding to the opening of the pixel definition layer on the spacer; and depositing an organic emission material through the mask opening, wherein the pixel definition layer includes a first opening and a second opening adjacent to each other along a first direction by an interval for each pixel, and a third opening adjacent to the first opening and the second opening by an interval along a second direction crossing the first direction, wherein the spacer is at a crossing point of a first imaginary line extending in the first direction and passing between the first opening and the third opening and a second imaginary line extending in the second direction and passing between the first opening and the second opening, and wherein an edge of the mask opening is separated from a top end of the spacer.

The edge of the mask opening may have a corner formed with a curve.

The depositing of the organic emission material may include forming a first organic emission layer by depositing a first organic emission material at the first opening of the pixel definition layer, forming a second organic emission layer by depositing a second organic emission material at the second opening of the pixel definition layer, and forming a third organic emission layer by depositing a third organic emission material at the third opening of the pixel definition layer.

According to the organic light emitting device as described above, the foreign substance accumulation that may otherwise be generated by the opening edge of the deposition mask may be reduced or prevented although the deposition process is executed while supporting the deposition mask by the spacer during deposition of the organic material.

Imprints due to the foreign substance accumulation may be prevented or reduced by preventing or reducing the foreign substance accumulation that may be generated by the opening edge of the deposition mask in the organic material deposition.

DETAILED DESCRIPTION

Figure 1:
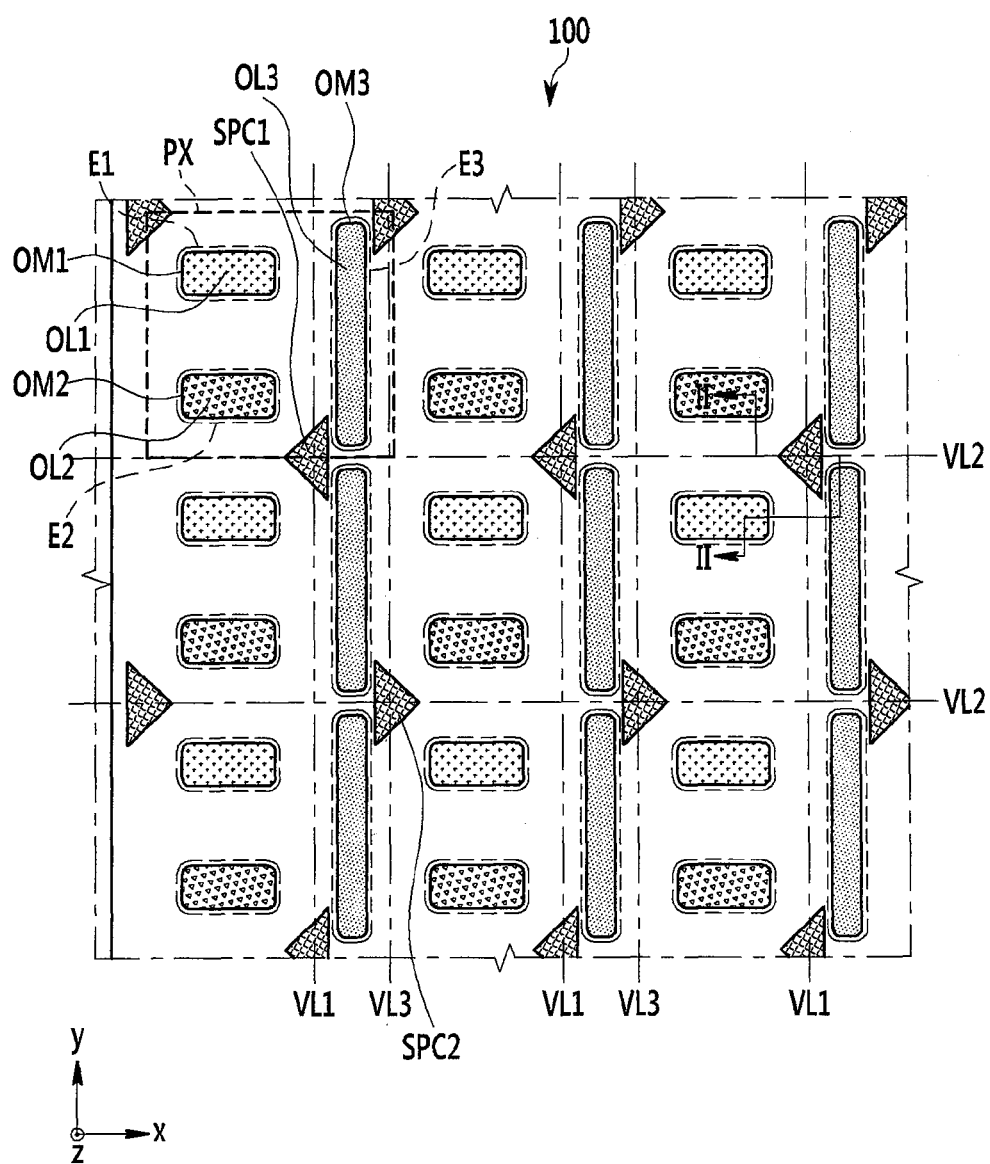
FIG. 1 is a top plan view partially showing a display area of an organic light emitting device according to a first example embodiment.

In the following detailed description, only certain example embodiments have been shown and described, simply by way of illustration. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification. In addition, the size and thickness of each configuration shown in the drawings are arbitrarily shown for understanding and ease of description, but the present invention is not limited thereto.

In description of the specification, "on" means a position above or below an objective member, but not a position necessarily above the objective member with reference to a gravity direction. Throughout this specification and the claims which follow, unless explicitly described to the contrary, the word "comprise" or variations such as "comprises" or "comprising" will be understood to imply the inclusion of stated elements but not the exclusion of any other elements.

Now, an organic light emitting device according to a first example embodiment will be described with reference to FIG. 1 and FIG. 2.

Figure 2:
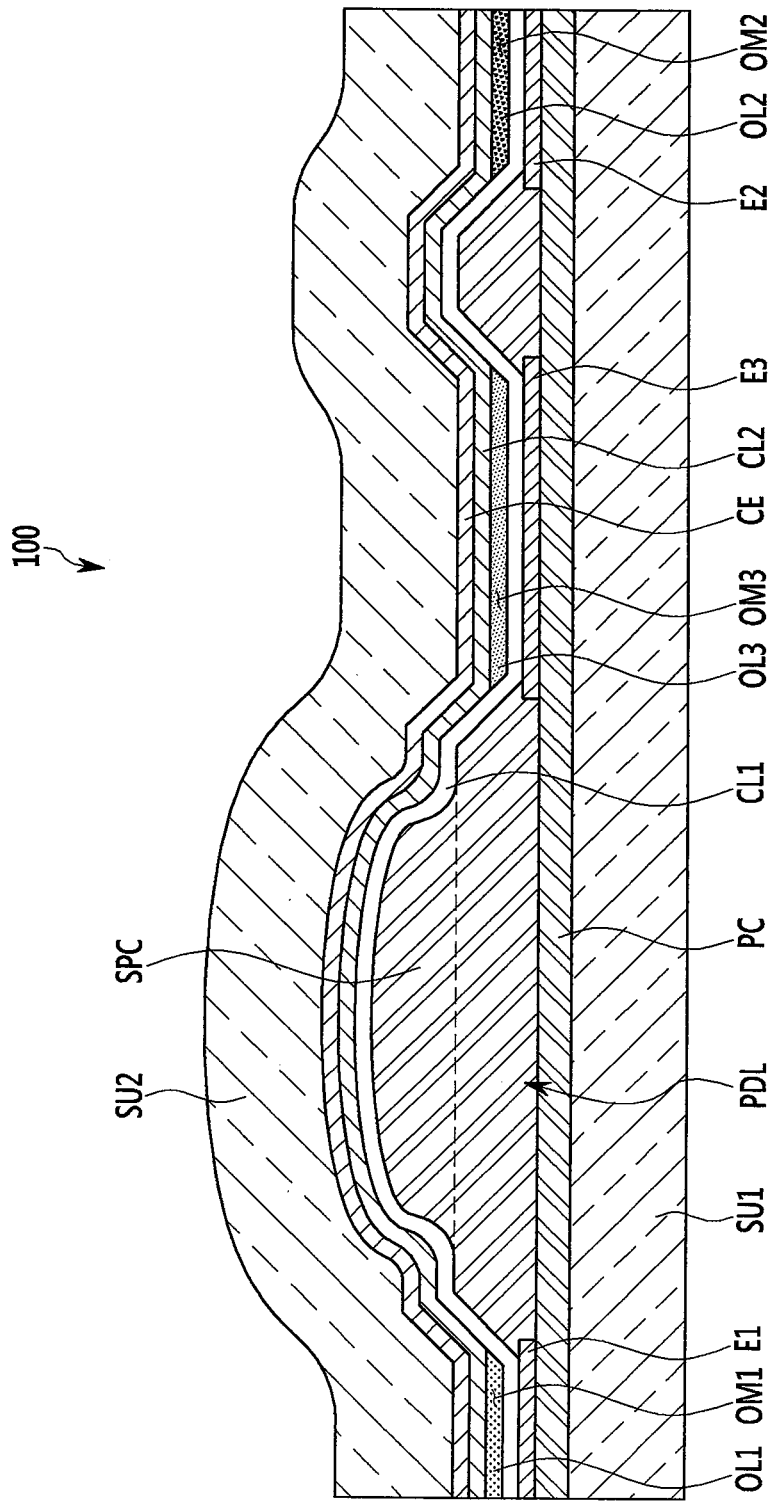
FIG. 2 is a cross-sectional view taken along the line II-II of FIG. 1.

FIG. 1 is a top plan view partially showing a display area of an organic light emitting device according to a first example embodiment, and FIG. 2 is a cross-sectional view taken along the line II-II of FIG. 1. In FIG. 1, for convenience, a first electrode, a pixel definition layer, an organic emission layer, and a spacer are mainly shown, and partial configurations that are irrelevant to the description are omitted, while in FIG. 2, a first substrate, a second substrate, a common electrode, and a common layer that are not shown in FIG. 1 are shown together.

As shown in FIG. 1 and FIG. 2, the organic light emitting device 100 according to the first example embodiment includes a first substrate SU1, a circuit portion PC, a first electrode E1, a second electrode E2, a third electrode E3, a pixel definition layer PDL, spacers SPC1 and SPC2, a first common layer CL1, a first organic emission layer OL1, a second organic emission layer OL2, a third organic emission layer OL3, a second common layer CL2, a common electrode CE, and a second substrate SU2.

The first substrate SU1 is formed of an insulating substrate, for example, is made of glass, quartz, ceramic, metal, plastics, and the like. Also, the first substrate SU1 may be a flexible substrate such as plastic, and thus the organic light emitting device 100 may have a flexible characteristic.

The circuit unit PC is positioned on the first substrate SU1, and may include wires including one or more scan lines, data lines, driving power lines, common power lines, and the like, and pixel circuits, such as two or more thin film transistors (TFT) and one or more capacitors, and the like, coupled to the wires so as to correspond to each pixel. The circuit unit PC may be formed to have various publicly known structures. Here, the pixel means a minimum unit displaying an image, and may include a plurality of subpixels displaying each color.

In the organic light emitting device according to the present example embodiment, a plurality of first electrodes E1 and second electrodes E2 are alternately arranged along a first direction (a y-axis direction), and a plurality of third electrodes E3 are arranged in parallel along the first direction while being positioned to be adjacent to the first electrode E1 and the second electrode E2 in a second direction (an x-axis direction) crossing the first direction. Accordingly, a plurality of first sub-pixel arrays including the first electrode E1 and the second electrode E2 and second sub-pixel arrays including the third electrode E3 are alternately arranged in the second direction.

The first electrode E1, the second electrode E2, and the third electrode E3 may respectively be an anode with a function of a hole injection electrode and a cathode with a function of an electron injection electrode. The first electrode E1, the second electrode E2, and the third electrode E3 may be formed as light transmissive electrodes, light transflective electrodes, or light reflective electrodes.

The pixel definition layer PDL is positioned on the first electrode E1, the second electrode E2, and the third electrode E3, and covers a border of each of the first electrode E1, the second electrode E2, and the third electrode E3. The pixel definition layer PDL includes first openings OM1, second openings OM2, and third openings OM3 through which a part of each of the first electrodes E1, the second electrodes E2, and the third electrodes E3 is exposed.

The first opening OM1 exposes a part of the first electrode E1, and substantially has a rectangular shape. The first opening OM1 is spaced apart from the third opening OM3 and the second opening OM2, and has a smaller area than that of the third opening OM3. The first opening OM1 has a rectangular shape, but is not limited thereto, and may have a polygonal shape, such as a triangle, a quadrangle, a pentagon, a hexagon, a heptagon, and an octagon shape. The number of first openings OM1 is plural corresponding to the plurality of first electrodes E1, and each of the plurality of first openings OM1 exposes a part of each of the plurality of first electrodes E1. The first organic light emission layer OL1 emitting red light is positioned on the first electrode E1 exposed by the first opening OM1. In the meantime, organic light emission layers emitting light of various colors, such as blue, green, and white, may be selectively positioned on the first electrode E1 exposed by the first opening OM1.

Here, the organic emission layer is formed at a region where an organic emission material is substantially deposited through an opening of a mask, and if a voltage or a current is applied to the electrode corresponding to the organic emission layer, a predetermined color of light is emitted.

The organic emission material may be, however, deposited on a region that is broader than an opening of the pixel definition layer, and thus the organic emission material may be positioned on the pixel definition layer and the spacer, because the organic emission layer is deposited through an opening of a mask and is formed at a region corresponding to the opening of the mask. However, in drawings and description explaining the present embodiment, the organic emission layer is defined as a region where the organic emission material is deposited and operates to emit light by applying a voltage or a current The second opening OM2 opens a part of the second electrode E2, and substantially has a rectangular shape. The second opening OM2 opens a part of the second electrode E2, and substantially has a rectangular shape. The second opening OM2 has a rectangular shape, but is not limited thereto, and may have a polygonal shape, such as a triangle, a quadrangle, a pentagon, a hexagon, a heptagon, and an octagon shape. The number of second openings OM2 is plural corresponding to the plurality of second electrode E2, and each of the plurality of second openings OM2 exposes a part of each of the plurality of second electrodes E2. The second organic light emission layer OL2 emitting green light is positioned on the second electrode E2 exposed by the second opening OM2. In the meantime, organic light emission layers emitting light of various colors such as blue, red, and white may be positioned on the second electrode E2 exposed by the second opening OM2.

The third opening OM3 exposes a part of the third electrode E3, and substantially has a rectangular shape having a pair of long sides and a pair of short sides corresponding to each other. The third opening OM3 is spaced apart from the first opening OM1 and the second opening OM2, and has a larger area than those of the first opening OM1 and the second opening OM2. The third opening OM3 has a rectangular shape, but is not limited thereto, and may have a polygonal shape, such as a triangle, a quadrangle, a pentagon, a hexagon, a heptagon, and an octagon shape. The number of third openings OM3 is plural corresponding to a plurality of third electrode E3, and each of the plurality of third openings OM3 exposes a part of each of the plurality of third electrodes E3. The third organic light emission layer OL3 emitting blue light is positioned on the third electrode E3 exposed by the third opening OM3. In the meantime, organic light emission layers emitting light of various colors, such as green, red, and white, may be selectively positioned on the third electrode E3 exposed by the third opening OM3.

The aforementioned first opening OM1, second opening OM2, and third opening OM3 are spaced apart from each other, and a short side of each of the first opening OM1 and the second opening OM2 faces a long side of the third opening OM3.

On the other hand, in FIG. 1, a first imaginary straight line VL1 passes between the first opening OM1 (or the second opening OM2) and the third opening OM3 included in the same pixel PX on a plane and extends in the first direction (the y-axis direction), a second imaginary straight line VL2 passes between the first opening OM1 and the second opening OM2 of the pixels PX adjacent to each other in the first direction and extends in the second direction (the x-axis direction), and a third imaginary straight line VL3 passes between the first opening OM1 (or the second opening OM2) and the third opening OM3 of the pixel adjacent to each other in the second direction and extends in the first direction.

In the present example embodiment, the spacers SPC1 and SPC2 include a first spacer SPC1 positioned at a crossing point of the first imaginary line VL1 and the second imaginary line VL2 and a second spacer SPC2 positioned at a crossing point of the third imaginary line VL3 and the second imaginary line VL2.

The spacers SPC1 and SPC2 are positioned throughout the boundary of the plurality of pixels arranged along the first direction and are alternately arranged for each pixel. That is, the first spacer SPC1 is arranged for two pixels along the first direction on the first imaginary line VL1, and the second spacer SPC2 is arranged for two pixels along the first direction on the third imaginary line VL3 and is alternately arranged with the first spacer SPC1 for each pixel.

In the present example embodiment, the plane shape of the spacers SPC1 and SPC2 is the triangular shape, a first side of the spacers SPC1 and SPC2 on the triangle extends in the first direction and is parallel to the long side of the third opening OM3, and a first apex facing the first side is protruded toward a region between the first opening OM1 and the second opening OM2. In this case, the first spacer SPC1 and the second spacer SPC2 are formed so as to face away from each other with the third opening OM3 interposed therebetween such that the first apex of the first spacer SPC1 and the first apex of the second spacer SPC2 are protruded in opposite directions.

As shown in FIG. 2, when viewed in a cross-section, the spacers SPC1 and SPC2 are positioned on the pixel definition layer PDL, a cross-sectional thickness of the center on the plane may be greater than the cross-sectional thickness of the edge, and this may be controlled according to process conditions. That is, in the cross-sectional shape of the spacers SPC1 and SPC2 has an edge on the plane that is low and the center height is gradually increased. Here, 'the plane shape' means a shape identified when viewing in the direction perpendicular to the surface of the first substrate SU1, and 'the cross-sectional shape' means a shape taken along a vertical cut to the surface of the substrate.

The spacers SPC1 and SPC2 may be integrally formed with the pixel definition layer PDS, or may be formed of a different material from that of the pixel definition layer PDL. When the spacers SPC1 and SPC2 are integrally formed of the material of the same kind as that of the pixel definition layer PDL, the boundary therebetween may be separated.

The first common layer CL1 is positioned on the first electrode E1, the second electrode E2, the third electrode E3, the pixel definition layer PDL, and the spacers SPC1 and SPC2, and may include one or more layers selected from a hole injection layer, a hole transporting layer, an electron injection layer, and an electron transporting layer.

The first organic light emission layer OL1 is positioned on the first common layer CL1 positioned on the first electrode E1 so as to correspond to the first opening OM1. The first organic light emission layer OL1 includes an organic material emitting red light, and may emit red light if an electronic signal is applied. In the meantime, the first organic light emission layer OL1 may include an organic material emitting light of green, blue, or white, and in this case, the first organic light emission layer OL1 emits light of green, blue, or white colors.

The second organic light emission layer OL2 is positioned on the first common layer CL1 positioned on the second electrode E2 so as to correspond to the second opening OM2. The second organic light emission layer OL2 includes an organic material emitting green light, and may emit green light if an electronic signal is applied. In the meantime, the second organic light emission layer OL2 may include an organic material emitting light of red, blue, or white, and in this case, the second organic light emission layer OL2 emits light of red, blue, or white colors.

The third organic light emission layer OL3 is positioned on the first common layer CL1 positioned on the third electrode E3 so as to correspond to the third opening OM3. The third organic light emission layer OL3 includes an organic material emitting blue light, and may emit blue light if an electronic signal is applied. In the meantime, the third organic light emission layer OL3 may include an organic material emitting light of red, green, or white, and in this case, the third organic light emission layer OL3 emits light of red, green, or white colors.

That is, the first organic light emission layer OL1, second organic light emission layer OL2, and third organic light emission layer OL3 emit light of different colors, respectively. Further, the third organic light emission layer OL3 emits blue light, either one of the first organic light emission layer OL1 and the second organic light emission layer OL2 emits red light, and the other one emits green light.

The second common layer LC2 is positioned on the first common layer CL1 positioned on the first organic light emission layer OL1, the second organic light emission layer OL2, the third organic light emission layer OL3, the pixel definition layer PDL, and the spacers SPC1 and SPC2, and may include one or more layer selected from a hole injection layer, a hole transporting layer, an electron injection layer, and an electron transporting layer.

The common electrode CE is positioned on the second common layer CL2 over an entire surface of the first substrate SU1, and may be a cathode serving as an electron injection electrode, or an anode serving as a hole injection electrode. The common electrode CE may be formed of a light transmissive electrode or a light reflective electrode.

The second substrate SU2 is formed of the insulating substrate, and in the present example embodiment, the second substrate SU2 may be formed of thin film encapsulation layers in which a plurality of organic layers and inorganic layers are alternately deposited. Also, the second substrate SU2 may be formed of the flexible substrate such as the plastic along with the first substrate SU1, and thus, the organic light emitting device 100 may be flexible.

Also, although not shown in FIG. 2, a capping layer CPL and a functional layer such as lithium fluoride (LiF) may be formed between the common electrode CE and the second substrate SU2.

Figure 3:
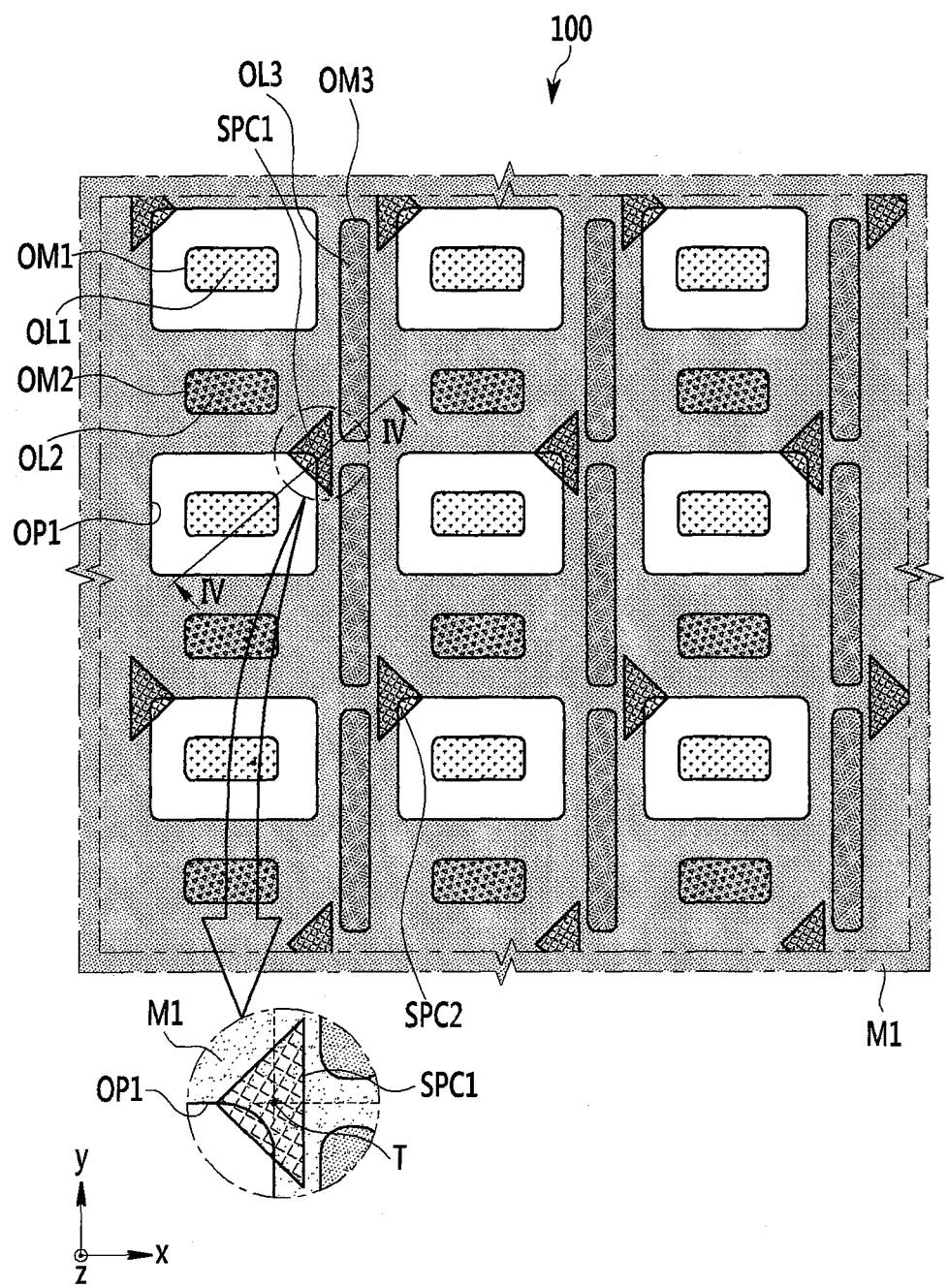
FIG. 3 is a top plan view of a state in which the display area of the organic light emitting device of FIG. 1 is partially covered by a deposition mask.
Figure 4:
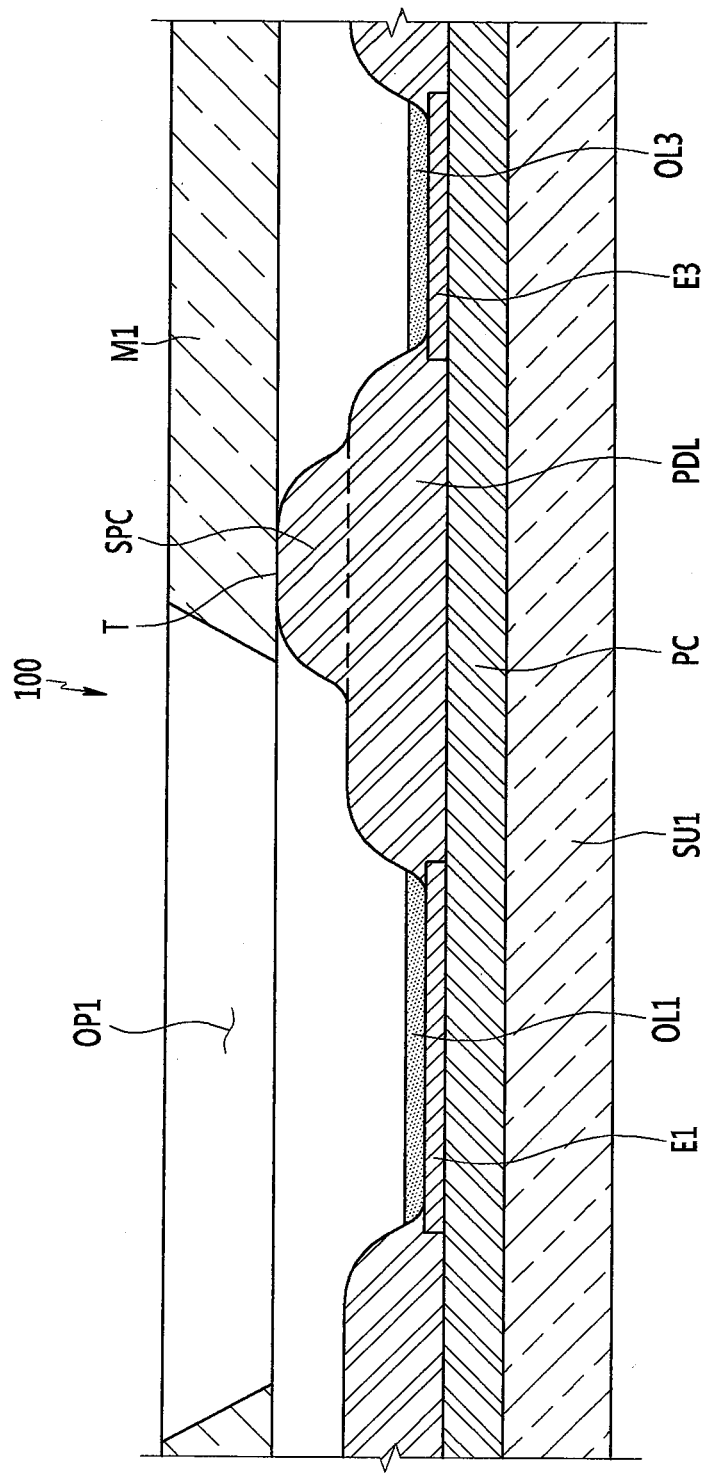
FIG. 4 is a cross-sectional view taken along the line IV-IV of FIG. 3.

FIG. 3 is a top plan view of a state in which the display area of the organic light emitting device of FIG. 1 is partially covered by a deposition mask, and FIG. 4 is a cross-sectional view taken along a line IV-IV of FIG. 3.

Referring to FIG. 3, for the deposition of the first organic emission material to the first opening OM1, the first deposition mask M1 may be used. In this case, the first deposition mask M1 includes a mask opening OP1 only formed at a portion corresponding to the first opening OM1, and the edge of the mask opening OP1 has a corner formed as a curved line.

Referring to the magnified view of FIG. 3 and FIG. 4, when forming the spacers SPC1 and SPC2 of the organic light emitting device 100 according to the present example embodiment, in the organic material deposition process, although the first deposition mask M1 is supported by the spacers SPC1 and SPC2, the edge of the opening OP1 of the first deposition mask M1 does not contact the uppermost end of the center T of the spacers SPC1 and SPC2. Accordingly, the foreign substance accumulation that may be generated by the edge of the opening OP1 of the first deposition mask M1 in the deposition process may be, reduced, minimized or prevented, and the imprint failure caused by the foreign substance accumulation may be prevented or reduced.

Figure 5:
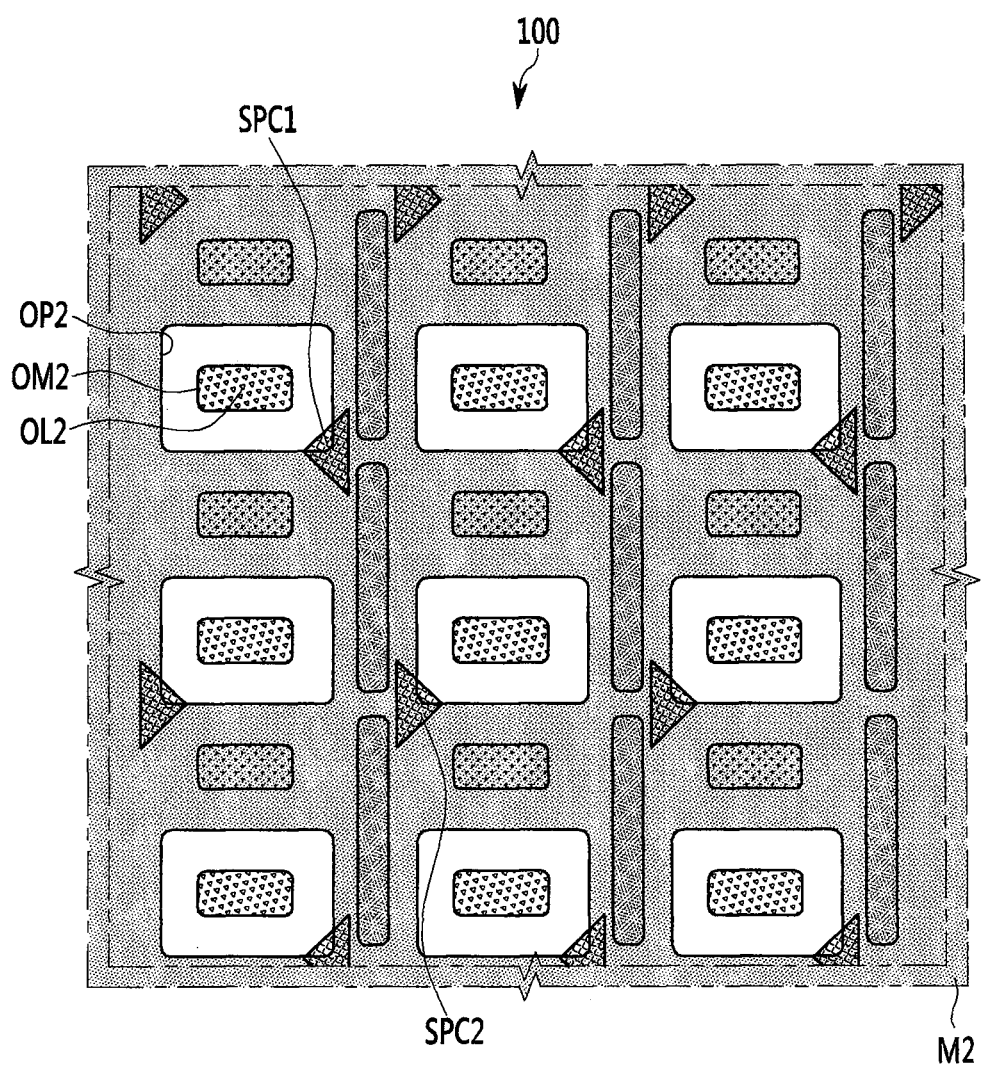
FIG. 5 and FIG. 6 are layout views showing a state in which a deposition mask for the organic material deposition of the pixel that is different from the deposition mask shown in FIG. 3 in the manufacturing process of the organic light emitting device shown in FIG. 1 is used.
Figure 6:
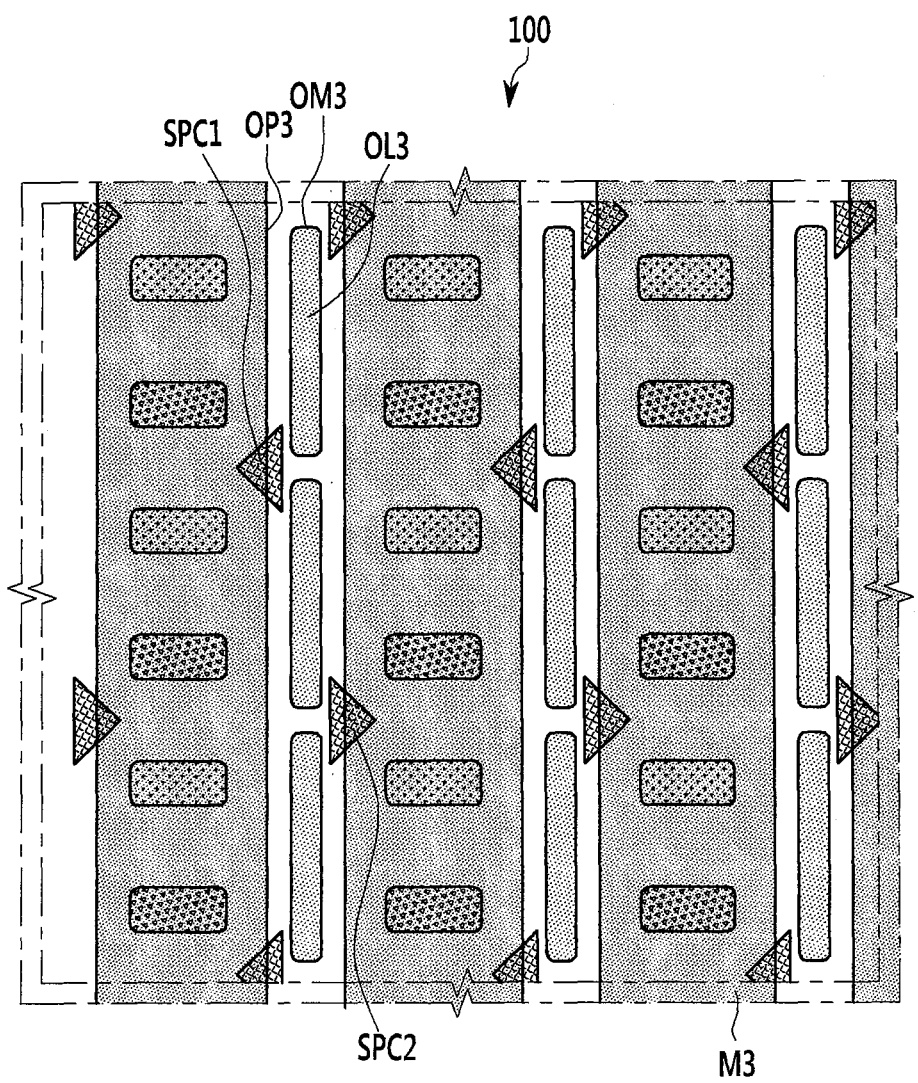

FIG. 5 and FIG. 6 are layout views showing a state in which a deposition mask for the organic material deposition of the pixel that is different from the deposition mask shown in FIG. 3 in the manufacturing process of the organic light emitting device shown in FIG. 1 is used.

That is, FIG. 5 shows a state of covering with the second deposition mask M2 to deposit the second organic emission material to the second opening OM2, and FIG. 6 shows a state of covering with the third deposition mask M3 to deposit the third organic emission material to the third opening OM3. In this case, the second deposition mask M2 is formed with the mask opening OP2 at the portion only corresponding to the second opening OM2, and the edge of the mask opening OP2 has the corner formed as a curved line. On the other hand, in the third deposition mask M3, mask openings OP3 are formed to be coupled to each other in the first direction by including the portion corresponding to the third opening OM3. However, the mask opening OP3 may be formed at the portion only corresponding to each third opening OM3.

Referring to FIG. 5 and FIG. 6, it may be confirmed that each of the deposition masks are supported by the spacers SPC1 and SPC2, in this case, the edges of the openings OP2 and OP3 of each deposition mask partially overlap the upper surface that is out of the center T of the spacers SPC1 and SPC2. Accordingly, the foreign substances accumulation that may be generated by the opening edge of the deposition masks M1, M2, and M3 in the deposition process may be minimized or prevented, and the imprint failure caused by the foreign substance accumulation may be prevented.

Figure 7:
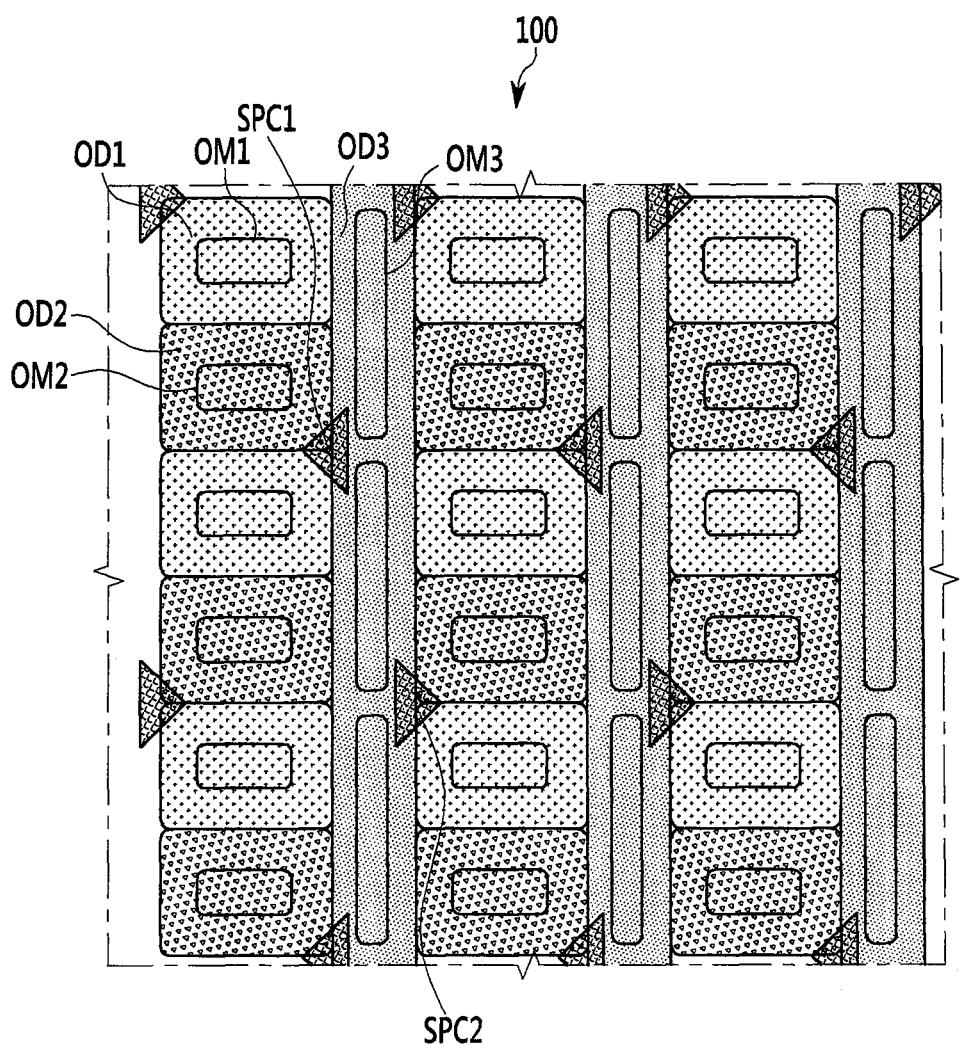
FIG. 7 is a top plan view showing a result of deposition of organic emission material using different deposition masks in due order for manufacturing the organic light emitting device shown in FIG. 1.

FIG. 7 is a top plan view showing a result of deposition of organic emission material using different deposition masks in due order for manufacturing the organic light emitting device shown in FIG. 1.

Referring to FIG. 7, the formation result of the first organic emission material layer OD1 deposited using the first deposition mask M1, the second organic emission material layer OD2 deposited using the second deposition mask M2, and the third organic emission material layer OD3 deposited using the third deposition mask M3 is shown.

Each of the organic emission material layers OD1, OD2, and OD3 are formed to have an area that is broader than each of the opening of the pixel definition layer PDL, and neighboring organic emission material layers may be adjacent in boundaries or partly overlapped. Accordingly, the organic emission material layer where the organic emission material is deposited may be positioned on the pixel definition layer or the spacer.

Figure 8:
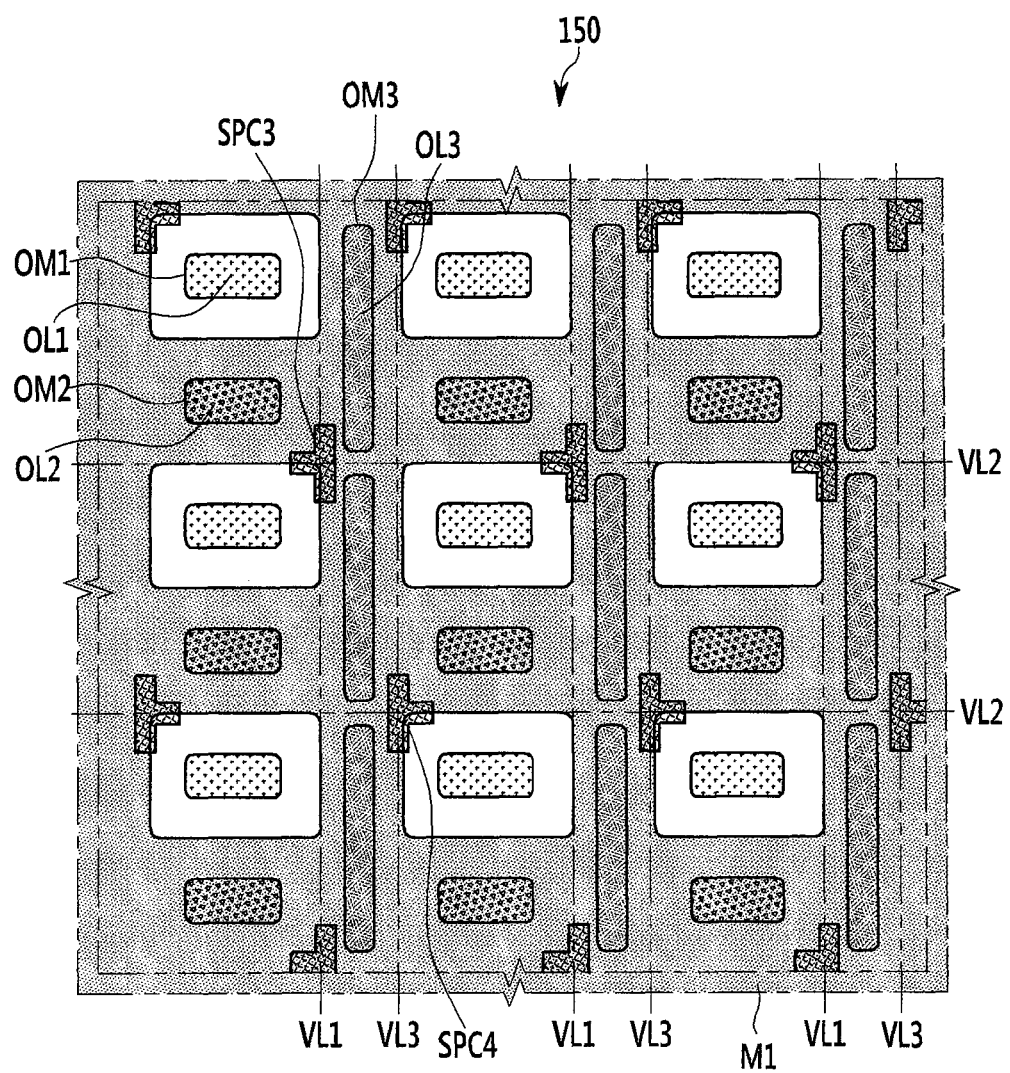
FIG. 8 is a top plan view partially showing a display area of an organic light emitting device according to a variation of the first example embodiment.

FIG. 8 is a top plan view partially showing a display area of an organic light emitting device according to a variation of the first example embodiment. In FIG. 8, for convenience, the pixel definition layer, the organic emission layer, and the spacer are mainly shown, as well as the deposition mask M1, and some configurations are omitted to simplify the description.

In the pixel definition layer PDL of the organic light emitting device 150 according to the present example variation, the first opening OM1, the second opening OM2, and the third opening OM3 are formed. The first opening OM1, the second opening OM2, and the third opening OM3 are respectively separated from each other, and each short side of the first opening OM1 and the second opening OM2 faces the long side of the third opening OM3.

Referring to FIG. 8, the organic light emitting device 150 has spacers SPC3 and SPC4 arranged at the same position as the organic light emitting device 100 according to the first example embodiment shown in FIG. 1.

That is, the spacers SPC3 and SPC4 include the third spacer SPC3 positioned at the crossing point of the first imaginary line VL1 and the second imaginary line VL2 and the fourth spacer SPC4 positioned at the crossing point of the third imaginary line VL3 and the second imaginary line VL2.

The spacers SPC3 and SPC4 are positioned throughout the boundary of a plurality of pixels arranged according to the first direction and are alternately arranged for each pixel. That is, the third spacer SPC3 are arranged on the first imaginary line VL1 along the first direction for two pixels, and the fourth spacer SPC4 is arranged on the third imaginary line VL3 along the first direction for two pixels and is alternately arranged with the third spacer SPC3 for each pixel.

The plane shape of the spacer SPC3 and SPC4 extends in the first direction, has the first side parallel to the long side of the third opening OM3, and may be formed of the polygon shape having the protrusion extending or protruding toward the region between the second opening OM2 and the first opening OM1 of the adjacent pixel. That is, the spacers SPC3 and SPC4 may include two protrusions protruding toward both sides along the first direction and a protrusion protruding in the direction facing the first side along the second direction.

The third spacer SPC3 and the fourth spacer SPC4 formed as described above are formed to be protruded in the direction away from the third opening OM3 at both sides of the third opening OM3 and are alternately arranged right and left along the first direction. That is, the third spacer SPC3 and the fourth spacer SPC4 are formed to face away from each other with the third opening OM3 interposed therebetween.

When viewing on the cross-section, the spacers SPC3 and SPC4 are formed on the pixel definition layer PDL, and the cross-sectional thickness of the center on the plane may be thicker than the cross-sectional thickness of the edge. That is, in the cross-sectional shape of the spacers SPC3 and SPC4, the edge on the plane is low and is increased closer to the center.

Figure 9:
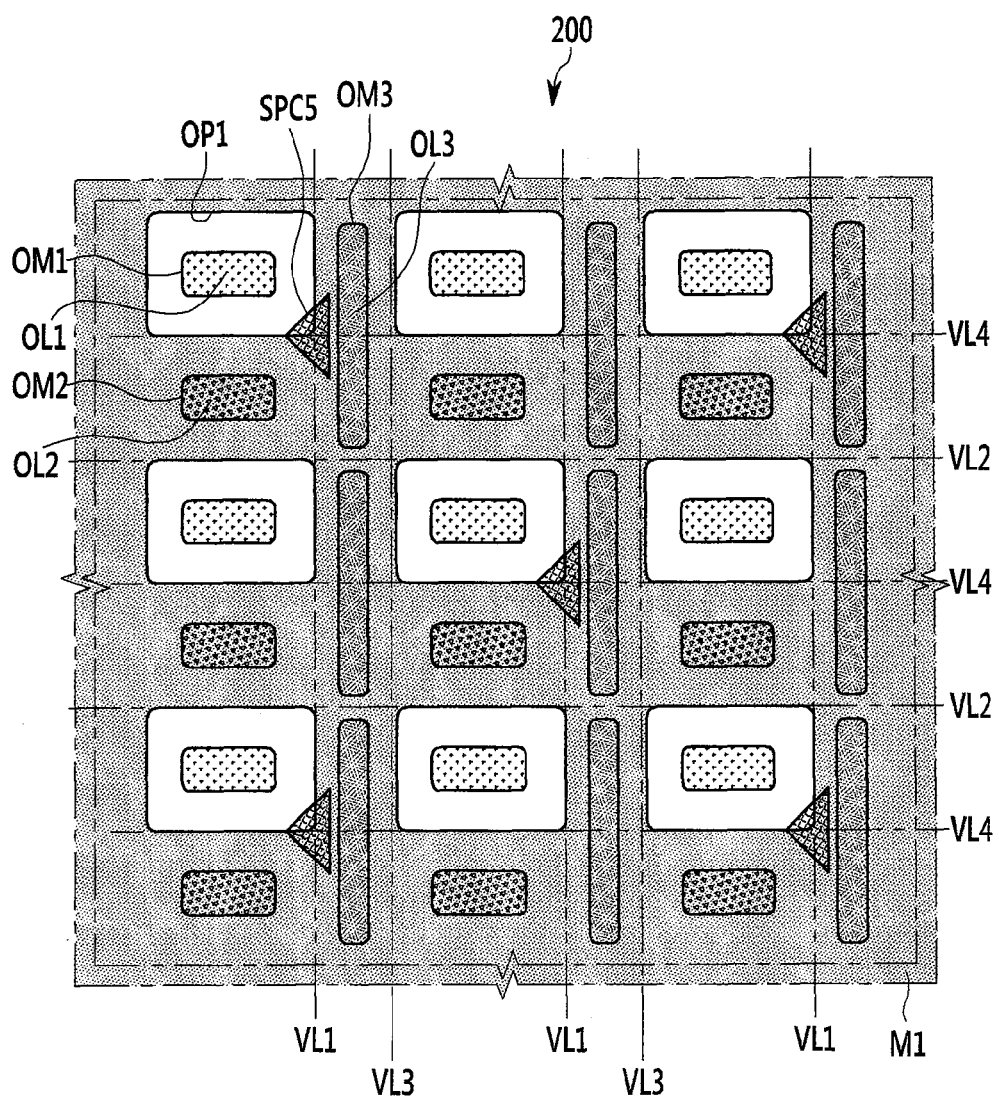
FIG. 9 is a top plan view partially showing a display area of an organic light emitting device according to a second example embodiment.

FIG. 9 is a top plan view partially showing a display area of an organic light emitting device according to a second example embodiment. In FIG. 9, for convenience, the pixel definition layer, the organic emission layer, and the spacer are mainly shown, the first deposition mask M1 is also shown, and the first electrode and the description of irrelevant configurations are omitted.

Referring to FIG. 9, in the organic light emitting device 200 according to the present example embodiment, the pixel definition layer and the organic emission layer are the same as those of the display area of the organic light emitting device shown in FIG. 1, however the formation position of a spacer SPC5 may be different.

In the pixel definition layer PDL of the organic light emitting device 200 according to the present example embodiment, the first opening OM1, the second opening OM2, and the third opening OM3 are formed. The first opening OM1, the second opening OM2, and the third opening OM3 are respectively separated from each other, and each cross-section of the first opening OM1 and the second opening OM2 faces the long side of the third opening OM3.

Referring to FIG. 9, a fourth imaginary line VL4 may be defined in addition to the first imaginary line VL1, the second imaginary line VL2, and the third imaginary line VL3 defined in FIG. 1. That is, the fourth imaginary line VL4 is defined by the imaginary straight line passing between the first opening OM1 and the second opening OM2 included in the same pixel and extending in the second direction.

In the present example embodiment, the spacers SPC5 are positioned at the crossing point of the first imaginary line VL1 and the fourth imaginary line VL4 and are alternately arranged for one pixel along the pixels arranged in the first direction and the second direction. Also, differently from the first example embodiment, the spacer is not positioned on the second imaginary line VL2 or the third imaginary line VL3.

The plane shape of the spacer SPC5 is formed as a triangle, the first side of the spacer SPC5 of the triangle extends in the first direction and is parallel to the long side of the third opening OM3, and the first apex facing the first side is positioned to be toward the region between the first opening OM1 and the second opening OM2 included in the same pixel.

As shown in FIG. 9, when forming the spacer SPC5 of the organic light emitting device 200 according to the present example embodiment, although the first deposition mask M1 is supported by the spacer SPC3 in the organic material deposition process, the edge of the opening OP1 of the first deposition mask M1 does not contact the center of the spacer SPC5. Accordingly, the foreign substance accumulation that may be generated by the edge of the opening OP1 of the first deposition mask M1 in the deposition process may be reduced, minimized or prevented, and the imprint caused by the foreign substance accumulation may be prevented.

In FIG. 9, the first deposition mask M1 is shown, however the deposition process of sequentially mounting the second deposition mask M2 and the third deposition mask M3 may be executed to respectively deposit the organic emission material at the second opening OM2 and the third opening OM3, and in this case, no edge of the openings OP2 and OP3 of the deposition masks M2 and M3 contact the center portion of the spacer SPC5.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims, and their equivalents.

| Description of symbols | |
| --- | --- |
| 100, 150, 200: emissive display device | CE: common electrode |
| CL1, CL2: common layer | E1: first electrode |
| E2: second electrode | E3: third electrode |
| M1, M2, M3: deposition mask | OL1, OL2, OL3: organic emission layer |
| OM1, OM2, OM3: opening | OP1, OP2, OP3: mask opening |
| PC: circuit portion | PDL: pixel definition layer |
| SPC1, SPC2, SPC3, SPC4, SPC5: spacer | |
| SU1: first substrate | SU2: second substrate |
| VL1, VL2, VL3, VL4: imaginary line | PX: pixel |

What is claimed is:

1. An organic light emitting device comprising:
    a first substrate;
    a plurality of electrodes on the first substrate;
    a pixel definition layer on the plurality of electrodes and comprising a plurality of openings and respectively exposing the plurality of electrodes, the pixel definition layer defining a plurality of pixels that each include a first subpixel, a second subpixel and a third subpixel which are able to emit colors being different from each other; and
    a spacer on the pixel definition layer,
    wherein the pixel definition layer comprises, for each pixel, a first opening and a second opening adjacent to each other along a first direction by an interval, and a third opening adjacent to the first opening and the second opening by an interval along a second direction crossing the first direction, wherein the first opening corresponds to the first subpixel, the second opening corresponds to the second subpixel, and the third opening corresponds to the third subpixel, and
    wherein the spacer is at a crossing point of a first imaginary line extending in the first direction and passing between the first opening and the third opening and a second imaginary line extending in the second direction and passing between the first opening and the second opening.

2. The organic light emitting device of claim 1, wherein a first organic emission layer is at the first opening of the pixel definition layer where a first organic emission material is located, a second organic emission layer is at the second opening of the pixel definition layer where a second organic emission material is located, and a third organic emission layer is at the third opening of the pixel definition layer where a third organic emission material is located.

3. The organic light emitting device of claim 2, wherein at least one of the first organic emission material, the second organic emission material, or the third organic emission material is on the pixel definition layer or the spacer.

4. The organic light emitting device of claim 1, wherein the first imaginary line passes between the first opening and the third opening in one pixel, the second imaginary line passes between the first opening and the second opening respectively in pixels adjacent to each other in the first direction and adjacent to each other, and the spacer comprises a first spacer at a crossing point of the first imaginary line and the second imaginary line.

5. The organic light emitting device of claim 4, further comprising a third imaginary line extending in the first direction and passing between the first opening and the third opening in the pixels adjacent to each other in the second direction and adjacent to each other, and the spacer comprises a second spacer at the crossing point of the second imaginary line and the third imaginary line.

6. The organic light emitting device of claim 5, wherein the first spacer and the second spacer are alternately arranged for each pixel along the first direction.

7. The organic light emitting device of claim 5, wherein the first spacer and the second spacer are alternately arranged for each pixel along the second direction.

8. The organic light emitting device of claim 5, wherein the first spacer and the second spacer face away from each other with the third opening interposed therebetween and protrude in opposite directions to each other.

9. The organic light emitting device of claim 1, wherein the spacer has a plane shape of a triangle.

10. The organic light emitting device of claim 9, wherein the spacer has a first side extending in the first direction, and a first apex facing the first side protrudes toward a region between the first opening and the second opening.

11. The organic light emitting device of claim 1, wherein the spacer has a first side extending in the first direction, and has a plane shape of a polygon having a protrusion facing the first side and protruding toward a region between the first opening and the second opening.

12. The organic light emitting device of claim 11, wherein the spacer has a protrusion respectively protruding toward a region between the first opening and the second opening, and a region between the first opening or the second opening and the third opening.

13. The organic light emitting device of claim 1, wherein the first imaginary line passes between the first opening and the third opening in one pixel, further comprising a fourth imaginary line extending in the second direction and passing between the first opening and the second opening in one pixel, and the spacer is at the crossing point of the first imaginary line and the fourth imaginary line.

14. The organic light emitting device of claim 13, wherein the spacer is alternately arranged for one pixel along the first direction.

15. The organic light emitting device of claim 13, wherein the spacer is alternately arranged for one pixel along the second direction.

16. The organic light emitting device of claim 13, wherein the spacer has a plane shape of a triangle.

17. The organic light emitting device of claim 16, wherein the spacer has a first side extending in the first direction, and a first apex facing the first side protrudes toward a region between the first opening and the second opening.

18. The organic light emitting device of claim 13, wherein the spacer has a first side extending in the first direction and has a plane shape of a polygon having a protrusion facing the first side and protruding toward a region between the first opening and the second opening.

19. The organic light emitting device of claim 18, wherein the spacer has a protrusion respectively protruding toward a region between the first opening and the second opening and a region between the first opening or the second opening and the third opening.

20. The organic light emitting device of claim 1, wherein, in the spacer, a cross-sectional thickness of a center on the plane is greater than a cross-sectional thickness of an edge on the plane.

* * * * *